United States Patent [19]

Paal et al.

[11] 4,015,986

[45] Apr. 5, 1977

[54] METHOD OF DEVELOPING AND STRIPPING POSITIVE PHOTORESIST

[75] Inventors: Gabor Paal, Stuttgart; Jürgen F. Wüstenhagen, Boeblingen, both of Germany

[73] Assignee: International Business Machines Corporation, Armonk, N.Y.

[22] Filed: Aug. 22, 1975

[21] Appl. No.: 607,000

[30] Foreign Application Priority Data

Oct. 3, 1974 Germany .......................... 2447225

[52] U.S. Cl. ........................................ 96/36; 96/33; 96/36.2; 96/36.3; 96/49; 156/643; 156/659

[51] Int. Cl.² ...................... G03C 5/00; G03F 7/08

[58] Field of Search ............. 96/36, 36.2, 33, 35.1, 96/91 D, 36.1, 36.3, 49; 156/13, 17

[56] References Cited

UNITED STATES PATENTS

| | | | |
|---|---|---|---|
| 3,046,117 | 7/1962 | Sus | 96/91 D |
| 3,180,732 | 4/1965 | Sus et al. | 96/91 D |
| 3,406,065 | 10/1968 | Uhlig | 96/91 D |
| 3,627,685 | 12/1971 | Lam | 96/33 |
| 3,639,185 | 2/1972 | Colom et al. | 96/36.2 |
| 3,759,711 | 9/1973 | Rauner et al. | 96/91 D |
| 3,814,641 | 6/1974 | Reinberg et al. | 156/17 |
| 3,871,929 | 3/1975 | Schevey et al. | 96/36.2 |
| 3,890,152 | 6/1975 | Ruckert et al. | 96/36 |
| 3,930,857 | 1/1966 | Bendz et al. | 156/17 |

FOREIGN PATENTS OR APPLICATIONS 572,560 3/1956 Canada .............................. 156/17

OTHER PUBLICATIONS

German et al., "J. of Photo Science", vol. 15, pp. 137–144, 5/1967.
Kaplan, "IBM Technical Discl. Bulletin", vol. 13, No. 2, 7/1970.
Kaplan et al., "IBM Technical Discl. Bulletin", vol. 14, No. 10, 3/1972.

*Primary Examiner*—Charles L. Bowers, Jr.
*Attorney, Agent, or Firm*—David M. Bunnell

[57] ABSTRACT

Baked novolak resin based positive photoresists are either developed after exposure or stripped, following the use of the pattern resist layer as an etch mask, in aqueous solutions of a combination of permanganate and phosphoric acid.

3 Claims, 2 Drawing Figures

METHOD OF DEVELOPING AND STRIPPING POSITIVE PHOTORESIST

BACKGROUND OF THE INVENTION

This invention relates generally to the removal of resist layers and more particularly to a method of dissolving positive photoresists which are based on novolak resins.

Photoresists are mainly required for photolithographic processes. In these processes, substrates are etched selectively. In order to permit this, the substrates are covered with a mask that is resistant to the etchant and which leaves exposed only those parts of the substrate which are to be etched. For making such a mask, the substrate is first covered with a continuous photoresist layer. After the drying of the photoresist, the applied layer is exposed to actinic radiation through a mask which, if a positive photoresist is used, shows the same pattern as the photoresist mask to be made. Positive photoresist has the characteristic feature that it becomes soluble upon exposure. When the photoresist layer is subjected to a suitable solvent after exposure, the previously exposed areas are dissolved, i.e. in other words, the photoresist layer is developed, to leave an etchant-resistant patterned mask of unexposed photoresist. After etching, the photoresist mask is no longer required and is stripped off. Photolithographic processes have reached considerable importance, particularly for the making of printed and integrated circuits. An essential criterion for the quality of a photolithographic process is the dimensional fidelity with which a respective pattern is etched. The growing microminiaturization and continuously increasing packing density of the components in integrated circuits is possible only because photolithographic processes have been continuously improved. Because the demands made on photolithographic processes are particularly high in semiconductor technology, the process described here is presented by means of procedural developments used in semiconductor technology. It should be pointed out, however, that the process described here can be employed generally in photolithography.

Below, "photoresist" always refers to "positive photoresists which contain alkali soluble, phenol-formaldehyde novolak resins", even if this precise wording is not used. These resists contain, in addition to the resin, a sensitizer such as a diazo ketone, for example, a naphthoquinone (1, 2)-diazide sulfonic acid ester as described in U.S. Pat. Nos. 3,201,239 and 3,666,473.

Those procedural steps in photolithography where the photoresist is partly or fully removed, i.e., the development of the photoresist mask and its removal after etching, are among the decisive factors for the usefulness of a photolithographic process. For developing patterns of novolak resin based positive photoresists, basic developers are generally used. Such developers cannot dissolve photoresist layers which have been baked. Baking decisively influences the resist adhesion on the substrate, the resist adhesion improving with rising temperature. Inferior resist adhesion causes undercutting. Good resist adhesion is therefore a condition for high dimensional fidelity of the etched pattern. High dimensional fidelity of the etched patterns becomes increasingly important, with rising microminiaturization in the manufacture of integrated circuits, and consequently the demands made on resist adhesion increase, too. The photoresist mask can, it is true, also be baked after developing, but since photoresist structures start to flow at temperatures higher than 140° C, which affects the dimensional fidelity of the photoresist mask and thus of the etched patterns, baking after developing has to remain below this temperature and, therefore, optimum resist adhesion cannot be achieved. The known development of the photolithographic process, as it has to take place owing to the basic developers, therefore, presents unsatisfactory results for patterns with small dimensions and high packing density.

When stripping the photoresist mask after etching, it is of essential importance to remove the photoresist without leaving any residues, and without affecting the substrate. A dry process is known where organic material is burned in a glow discharge. The process reliably removes photoresist, but it is time-consuming and involves a great amount of apparatus, and there is the danger that ions are generated by electron bombardement in the oxide layers. This cannot be tolerated particularly when making field effect transistor components. Known processes for the wet chemical removal of positive photoresists also have problems with respect to one or more of the following: expense, removal, disposal, process conditions and hazards and attack or contamination of the substrate.

BRIEF SUMMARY OF THE INVENTION

It is the object of the invention to provide a method of reproduceably developing selectively exposed and baked layers of positive photoresist, and for stripping unexposed baked layers of positive photoresist, which method is not expensive, does not involve complex apparatus, and which can be carried out without having to observe safety measures exceeding the standard regulations. The process avoids the absorption of disturbing metal impurities by the substrate, the developed photoresist mask has very good adhesion and the etched pattern represents, within very small tolerances, the pattern of the exposure mask. Also, the substrates from which the photoresist has been removed are completely free of stains.

According to the process of invention, a baked novolak resin based positive photoresist is dissolved by an aqeuous solution of a permanganate ($MnO_4^-$), and phosphoric acid ($H_3PO_4$).

DETAILED DESCRIPTION

Figure 1:
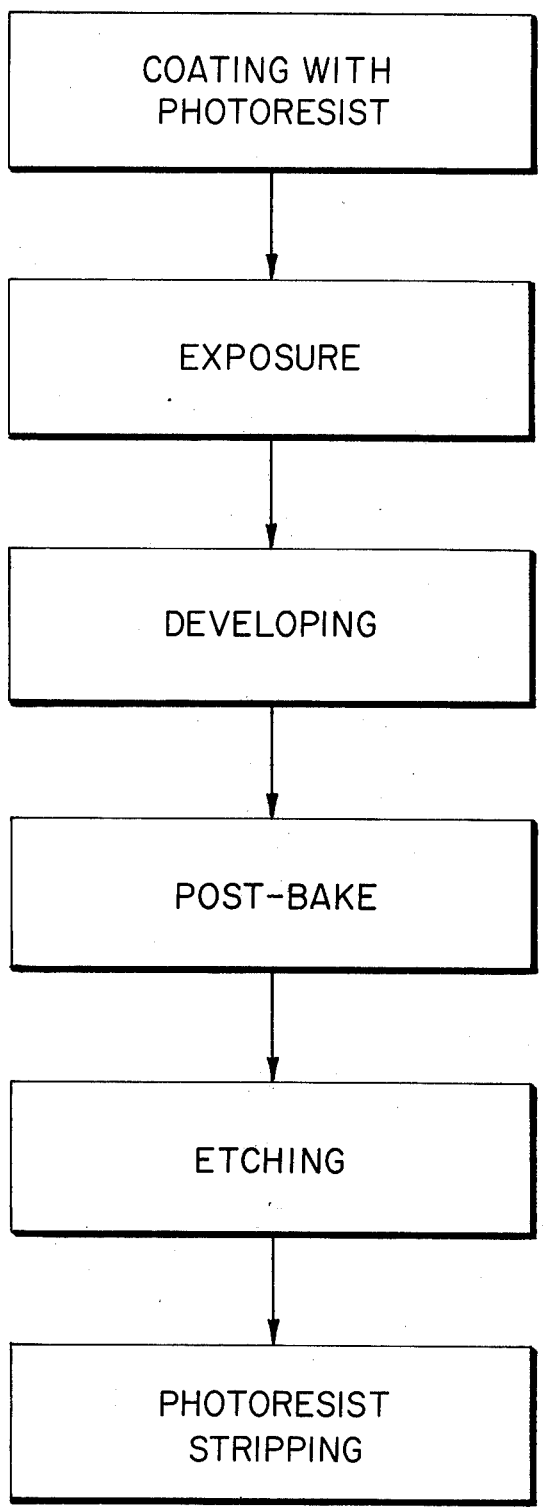
FIG. 1 is a flow diagram of the photolithographic process using positive photoresist with the stripping of the photoresist mask being accomplished by means of the process of the invention.

The chemicals used in the developing and stripping solution of the invention are not expensive and are commercially available in a very pure form. The solution is preferably placed in an open tank and the photoresist layers to be processed are immersed in the solution for a predetermined time. The chemicals are soluble in water and present a safety hazard only in their concentrated form. The solution can, therefore, be handled without having to observe safety rules exceeding the standard regulations, and the disposal of the solution after use does not present any problems. The permanganate cation is preferably potassium or ammonium. When ammonium permanganate is used, no metal is employed in the process according to the invention apart from the non-disturbing manganese; if potassium permanganate is used, a small absorption of potassium at the substrate cannot be excluded but the thus absorbed quantity is generally not a disturbing factor in semiconductor structures. The great advantage of the process according to the invention consists particularly in that the exposed areas of a selectively exposed and baked layer of positive photoresist dissolve much quicker than the unexposed areas. Consequently, contrary to the known methods, the photoresist layer can be baked prior to developing. This is an advantage from two points of view. As already mentioned above, baking after developing can be performed at temperatures of up to 130° C at a maximum to avoid resist flow This results in non-optimal resist adhesion.

Because according to the invention, baking takes place prior to developing, baking can be done at temperatures of up to 210° C. This results is excellent resist adhesion and, consequently, very high dimensional fidelity of the etched pattern. Because the photoresist is still a continuous layer, no flow of the photoresist occurs. Compared with the known processes, the method of the invention, therefore, permits better resist adhesion without the problem of resist pattern flow. If the process according to the invention is used for stripping the photoresist mask, clean surfaces are obtained. Summing-up, the method according to the invention can be very advantageously employed for both developing the photoresist mask and for stripping the photoresist mask when it is no longer needed.

It is advantageous to use a solution containing between about 2 and about 30 percent by weight $H_3PO_4$ and between about 0.038 and about 1.5 percent by weight $MnO_4^-$. Solutions containing less than 2 percent by weight $H_3PO_4$ and less than 0.038 percent by weight $MnO_4^-$ do not act with a speed which suffices for their being used in a manufacturing process. Solutions containing more than 30 percent by weight $H_3PO_4$ and more than 1.5 percent by weight $MnO_4^-$ affect metallic substrates, e.g., substrates of aluminum. Solutions whose concentration exceeds the given range dissolved the photoresist layers (with the exception of those layers that are unexposed and baked at high temperatures) so quickly that the process is difficult to control.

A specific advantage of the method as disclosed by the invention consists in that the dissolving can be carried out at room or ambient temperature. A controlled thermostat for keeping the solution on a predetermined temperature is thus superfluous, so that the apparatus required is less comprehensive. There is also no danger of a change in the concentration of the solution owing to evaporation losses.

Developing is advantageously carried out in such a manner that layers of positive photoresist, which have been selectively exposed and subsequently baked at temperatures between 130° and 210° C., are placed into the solution until the exposed areas have been dissolved. Particularly favorable results have been obtained when the exposed areas of a photoresist layer, baked for 30 minutes at approx. 180° C, have been dissolved, by a solution containing approx. 10 percent by weight $H_3PO_4$ and approx. 0.15 percent by weight $MnO_4^-$. The exposed and baked areas of the photoresist layer are dissolved about three or four times faster than its non-exposed and baked areas. Under the above specified conditions, an exposed and baked photoresist layer of 1.6 $\mu$ thickness has been dissolved in about 9 minutes.

The photoresist mask, which is no longer required after etching, as well as protective positive photoresist layers which have been applied in the meantime can be removed using the process of the invention. Unexposed positive photoresist layers, which have been baked at temperatures between 130° and 210° C, are immersed in the solution for a predetermined time. For layers baked at temperatures higher than 180° C it is of advantage, when minimum processing time is desired, to use solutions whose concentration is at the upper limit of the given ranges.

An unexposed photoresist layer of 0.8 $\mu$ thickness baked for 30 minutes at 140° C, can advantageously be removed in about 5 minutes when it is processed with a solution containing approx. 4.8 percent by weight $H_3PO_4$ and approx. 0.15 percent by weight $MnO_4^-$. A way of removing such layers is needed when a selectively exposed layer of positive photoresist has been developed by means of the known process using a basic developer, and subsequently baked at 140° C.

Figure 2:
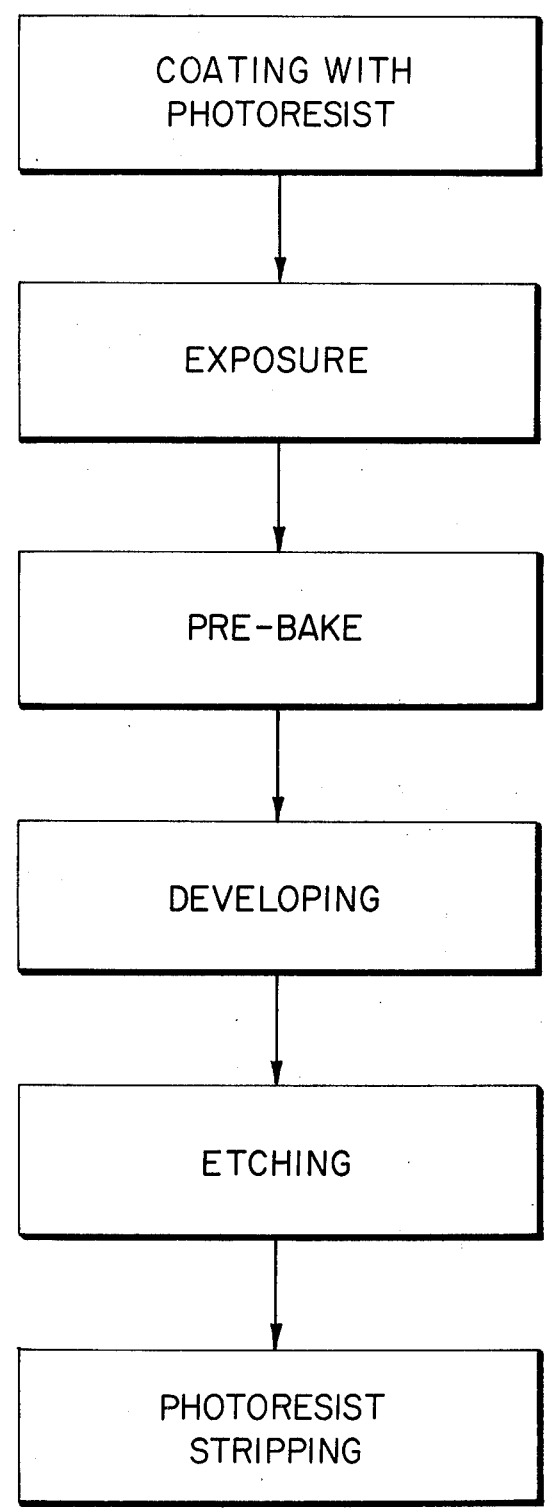
FIG. 2 Is a flow diagram of the photolithographic process using positive photoresist, as it is carried out when the developing and the stripping of the photoresist mask, or only the developing are carried out by means of the process of the invention.

The invention will be further described by means of embodiments as illustrated in the drawings. In the known photolithographic process which is represented in FIG. 1 the substrate is coated in the first procedural step with the photoresist dissolved in a solvent. Subsequently, the solvent is evaporated, preferably placing the substrate on a heating plate heated to 100° C. In the following process step, the photoresist layer is exposed patternwise through an exposure mask with the exposed areas becoming soluble in the developer. Developing by using a basic developer takes place in the next step. Subsequently, the photoresist layer is baked at 140° C in order to improve the adhesion of the photoresist on the substrate. As explained above, it would be more favorable to do the baking prior to developing; but the basic developer does not permit this. After baking, the substrate is processed with an etchant in which it is soluble. The substrate consists for instance of silicon dioxide or of aluminum; in that case the etching is done with buffered hydrofluoric acid or phosphoric acid, respectively. Finally, the photoresist mask is stripped off. This can take place by means of the process described here, using an aqeuous solution of permanganate and phosphoric acid. When the possibilities offered by the process described here are fully utilized, the photolithographic process is executed as shown by FIG. 2. The coating and the exposing processes are performed exactly as in the known process. After exposure and prior to developing, however, the photoresist layer is baked. As mentioned above, this has advantages compared with the known method. The photoresist layer can be baked at temperatures of up to 210° C without there being any difficulties in developing or in the later stripping-off of the photoresist mask. Developing takes place in the next step by means of the method described here using the permanganate and phosphoric acid solution. The subsequent etching is done exactly as in the known process. Finally, the photoresist mask is stripped off, for which purpose the process described here can again be advantageously employed.

The process of the invention is simple in every respect (obtaining the materials, making the solution, carrying-out, dumping of the used solution). The reason for the effectiveness of the solutions is not known.

Permanganate and phosphoric acid are commercially available. Potassium or ammonium are preferred as the permanganate cation, the latter particularly in those cases where, as in the manufacture of field effect transistors, metal cations should be excluded. Both salts are available in highest chemical purity. Generally, but not necessarily, the phosphoric acid is used in the form of 85% phosphoric acid (water content: 15%). The phosphoric acid-water mixture, too, is available in highest chemical purity. For making a solution of the desired composition, a phosphoric acid quantity calculated in consideration of the water content is dissolved in a predetermind quantity of water, and a calculated quantity of permanganate is added to this solution. The dissolving of the permanganate can be accelerated by stirring. After the complete dissolution of the permanganate, the solution is immediately ready for use. It is preferably used at room temperature. When carrying out the process described here, the photoresist coated substrates, placed in a substrate holder and are immersed in the solution which is conveniently provided in an open tank. After a predetermined time, the substrate holder is taken out of the solution and then placed under running water to rinse off the solution residues. Subsequently, the substrates are either dried or, when developing has taken place in accordance with the process, placed immediately into the etching bath.

Solutions containing between about 0.05 and about 2 percent by weight potassium permanganate (with the use of ammonium permanganate the percentages would be slightly altered owing to the different cation weight) and between about 2 and about 30 percent by weight phosphoric acid are particularly suitable for the use in the method described here. Solutions of lower concentrations dissolve too slowly. Solutions of higher concentration clearly attack metallic, e.g., aluminum, substrates. Solutions with a concentration within the given limits can be used for more than two weeks. When using the developing process described here, a solution containing about 0.2 percent by weight potassium permanganate and about 10 percent by weight phosphoric acid, was found to be particularly suitable because then the development is sufficiently slow to be controlled and yet is within a process time sufficiently short for a manufacturing process. The same applies to a solution containing about 0.2 percent by weight potassium permanganate and about 4.8 percent by weight phosphoric acid, when it is used for stripping off a photoresist mask baked at 140° C. Photoresist masks that have been baked at 180° C are, however, soluble rather slowly in a solution of this concentration. For such masks it is better to use solutions of higher concentration in order to arrive at acceptable process times.

The following five examples illustrate the process in more detail. The concentrations of potassium permanganate and phosphoric acid used for the examples, the test conditions, and the substrate materials by which the individual examples differ from each other are listed in the Table.

TABLE

| Example Number | Pre-Processing of photoresist layer to be stripped off | | Layer thickness $\mu$ | Substrate material | Solution Composition weight % | | Duration of reaction (min) |
| --- | --- | --- | --- | --- | --- | --- | --- |
| | Exposure* | Baking Temperature | | | $KMnO_4$ | $H_3PO_4$ | |
| 1 | yes | 180° C | 1.6 | $SiO_2$ | 0.2 | 10 | 9 |
| 2 | yes | 140° C | 1.6 | Al | 0.2 | 10 | 9 |
| 3 | no | 140° C | 0.8 | $SiO_2$ | 0.2 | 4.8 | 5 |
| 4 | no | 180° C | 0.8 | $SiO_2$ | 0.2 | 4.8 | 27 |
| 5 | no | 180° C | 0.8 | Al | 0.2 | 4.8 | 27 |

*Exposure until 90% of the sensitizer in the photoresist has been decomposed.

In all examples, five semiconductor wafers with a diameter of approx. 57 mm were used. Onto all these semiconductor wafers a thermal $SiO_2$ layer was grown, and onto the semiconducter wafers used in examples 2 and 5 an additional aluminum layer was vapor-deposited. The photoresist marketed by Shipley under the trade name, AZ 1350 J, was used as the positive photoresist. This is a photoresist of the novolak type which contains an m-cresol-formaldehyde novolak resin and a diazo keton sensitizer such as a 4 or 5-substituted diazonaphthoquinone.

In examples 1 and 2, the process for developing selectively exposed photoresist layers, as described here, was used. Moreover, the photoresist layers went through the procedure illustrated by means of FIG. 2. Exposure in example 1 took place through a mask with a fine pattern of rectangular windows whose smallest dimensions lay at about 1 $\mu$, and in example 2 through a mask with a pattern of fine conductors with a diameter between 1 and 5 $\mu$. After the removal of the photoresist mask the etched substrates were examined visually under a microscope, an excellent correspondence between the etched patterns and the pattern on the mask was found within very small tolerances.

In examples 3 to 5, the described process was used for stripping off unexposed, baked photoresist layers. The preliminary processing of these layers substantially corresponds to that to which those photoresist masks are subjected which are to be stripped off after etching; i.e., the layers of example 3 have been pre-processed in accordance with the procedural steps of FIG. 2. The photoresist layers were subjected to a solution containing potassium permanganate and phosphoric acid until they were completely removed. As indicated by the Table, if the same concentrations are used in the solution, the layers baked at 180° C have to stay in the solution much longer than the layers baked at 140° C. A visual inspection under a microscope showed for all samples a completely clean, unstained surface. Besides, no aluminum etching at all could be found on the substrates of example 5 due to the stripping solution.

Finally, it should be pointed out that the tests described by means of examples 1 to 5 have been carried out a period of two weeks, during which the two solutions used were not changed. In both solutions, up to 30 semiconductor chips were processed. The process times did not extend with the service life, the sample fidelity of the etched substrates and the quality of the substrate surfaces from which the photoresist had been removed remained excellent.

We claim:

1. A method of forming a patterned resist mask on a substrate comprising coating a layer of novolak resin based positive photoresist comprising an alkali-soluble phenolformaldehyde novolak resin and a 1,2-diazide naphthoquinone sensitizer, on said substrate, selectively exposing said layer to actinic radiation through a patterned mask, subsequently baking said layer at a temperature between 130° and 210° C, and then developing said layer with an aqueous solution consisting essentially of between about 0.038 and 1.5 percent by weight of a permanganate and between about 2 to 30 percent by weight of phosphoric acid such that only the exposed areas of said layer area completely removed to leave a patterned resist mask of unexposed resist on said substrate.

2. The process of claim 1 wherein the aqeuous solution contains about 10% by weight phosphoric acid and about 0.15% by weight permanganate.

3. The process of claim 1 including the additional steps, following the formation of the patterned resist mask, of etching the exposed portion of the substrate through the resist mask and then stripping the resist mask from the substrate with an aqueous solution consisting essentially of between about 0.038 and 1.5 percent by weight of potassium or ammonium permanganate and between about 2 to 30 percent by weight of phosphoric acid.

* * * * *